United States Patent [19]

Gillessen et al.

[11] Patent Number: 4,563,590

[45] Date of Patent: Jan. 7, 1986

[54] ARRANGEMENT WITH SEVERAL PHOTOTRANSISTORS

[75] Inventors: Klaus Gillessen, Untergruppenbach, Fed. Rep. of Germany; Christopher Malinowski, Bridgewater, N.Y.

[73] Assignee: Telefunken Electronic GmbH, Heilbronn, Fed. Rep. of Germany

[21] Appl. No.: 493,295

[22] Filed: May 10, 1983

[30] Foreign Application Priority Data

Jun. 8, 1982 [DE] Fed. Rep. of Germany ....... 3221520

[51] Int. Cl.$^4$ ............................................. H01J 40/14
[52] U.S. Cl. .................................... 250/578; 250/208; 307/473; 358/212
[58] Field of Search ....................... 250/578, 208, 209; 364/488, 489, 490, 491; 340/825.79, 825.9; 365/72; 307/473, 299 R; 358/212, 213

[56] References Cited

U.S. PATENT DOCUMENTS

| | | | |
|---|---|---|---|
| 3,706,129 | 12/1972 | McCann | 29/583 |
| 4,037,114 | 7/1977 | Stewart et al. | 307/473 |
| 4,293,735 | 10/1981 | Duret | 340/166 R |
| 4,463,383 | 7/1984 | Soneda et al. | 250/578 |

FOREIGN PATENT DOCUMENTS

| | | |
|---|---|---|
| 2137534 | 2/1972 | Fed. Rep. of Germany . |
| 2837076 | 3/1980 | Fed. Rep. of Germany . |
| 3135740 | 5/1982 | Fed. Rep. of Germany . |
| 3141975 | 5/1982 | Fed. Rep. of Germany . |

Primary Examiner—John K. Corbin
Assistant Examiner—R. B. Eyssallenne
Attorney, Agent, or Firm—Spencer & Frank

[57] ABSTRACT

An arrangement with several phototransistors wherein the phototransistors are interconnected in such a way that n (n−1) (n−2) phototransistors can be triggered with n leads, n being one whole number larger than or equal to 3, the three connections emitter, base and collector of each phototransistor being connected to three different leads, no two phototransistors being connected in the same way to the same leads, the leads being able to take on three states, i.e., (1) grounded, (2) open and (3) connected to a voltage source, of the leads at a certain point in time only one lead being open and only one other lead being connected to the voltage source, the voltage source, on the one hand, being so small that it cannot drive a noticeable current over the base-emitter path of each phototransistor, but, on the other hand, being sufficiently large to be able to drive a noticeable current over the collector-emitter path of a phototransistor if this phototransistor is illuminated, and a flow of current being ascertainable for each lead when this lead is in the grounded state.

4 Claims, 2 Drawing Figures

ARRANGEMENT WITH SEVERAL PHOTOTRANSISTORS

BACKGROUND OF THE INVENTION

Today, arrangements with several phototransistors are used in numerous applications, e.g., for position sensors and video recording equipment. These phototransistors almost always consist of the semiconductor material silicon because its technology has been furthest developed. With this technology, integrated arrangements are also relatively easily realized, i.e., arrangements containing several transistors in a single semiconductor crystal. In the known arrangements, one lead is generally provided for each phototransistor, as well as a common return line for all phototransistors. In order to achieve a high degree of spatial resolution, a large number of phototransistors and thus also a large number of leads is necessary. This high number of leads causes considerable technical problems, such as, for example, large space requirement, low degree of reliability and substantial work load.

Arrangements are known which feature light-sensitive elements such as photodiodes, phototransistors or photoresistors which make do with substantially fewer connections. For example, with n connections, $n(n-1)$ light-sensitive elements can be driven, i.e., for example, 240 light-sensitive elements with 16 connections.

SUMMARY OF THE INVENTION

It is an object of the invention to achieve a further reduction in the number of connections in arrangements comprising several light-sensitive elements. According to the invention, the phototransistors are interconnected in such a way that $n(n-1)(n-2)$ phototransistors can be triggered with n leads (n being one whole number larger than or equal to 3), the three connections emitter, base and collector of each phototransistor are connected to three different leads, no two phototransistors are connected in the same way to the same leads, the leads can take on three states, i.e., (1) grounded, (2) open and (3) connected to a voltage source, of the leads at a certain point in time only one lead is open and only one other lead is connected to the voltage source, the voltage source is so small, on the one hand, that it cannot drive a noticeable current over the base-emitter path of each phototransistor, but, on the other hand, is sufficiently large to be able to drive a noticeable current over the collector-emitter path of a phototransistor if this phototransistor is illuminated, and a flow of current is ascertainable for each lead when this lead is in the grounded state.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
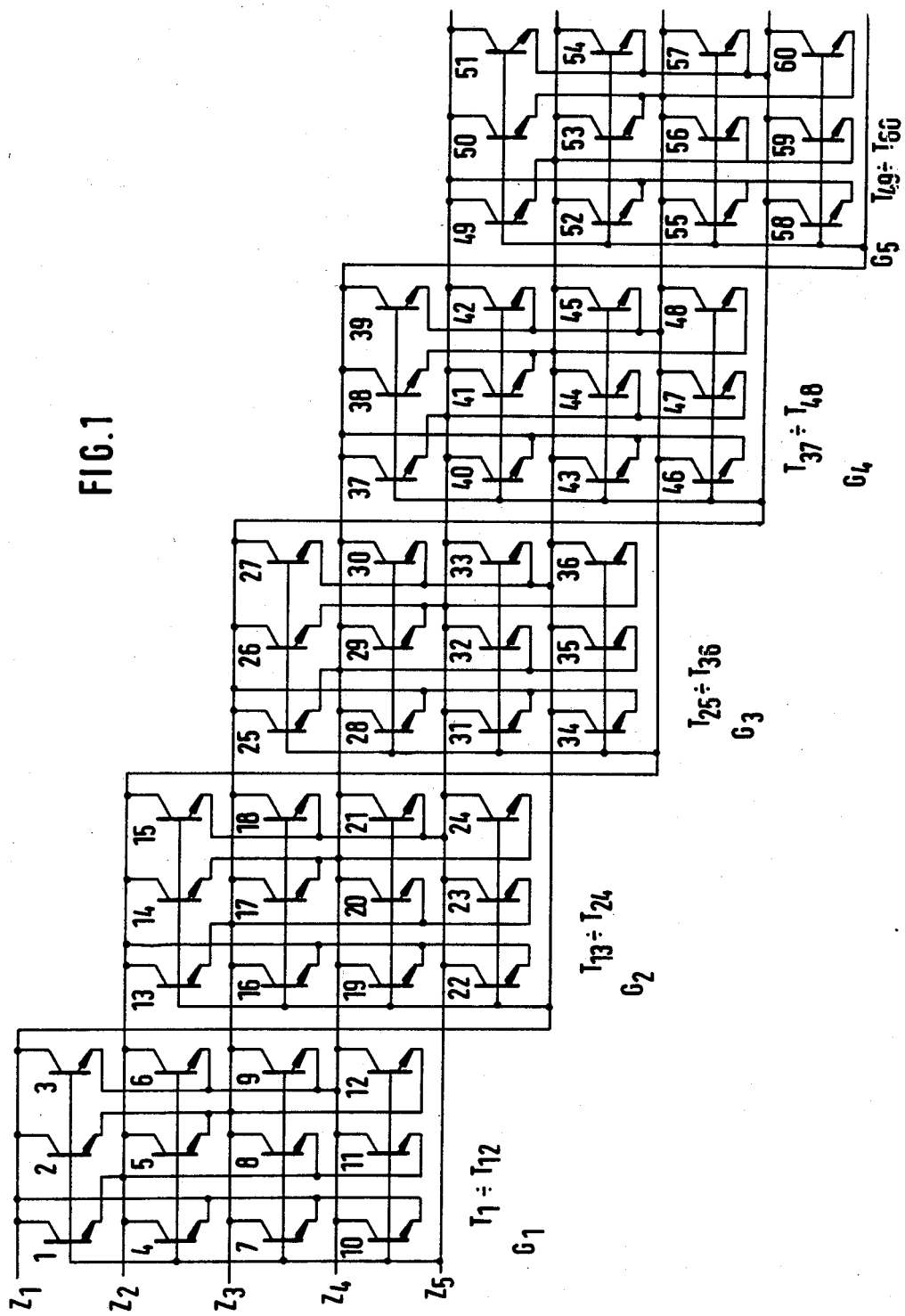
FIG. 1 shows an arrangment with 60 phototransistors which are connected to five leads in a certain manner.

FIG. 1 shows an arrangement consisting of 60 phototransistors $T_1 \ldots T_{60}$ which are connected to 5 leads $Z_1 \ldots Z_5$ in such a way that the three connections (emitter, base, collector) of each phototransistor are connected to three different leads out of the group of the 5 leads $Z_1 \ldots Z_5$, but no two phototransistors are connected to the same leads in the same manner. According to the rules of combinatorial analysis, precisely $n(n-1)(n-2)$ phototransistors can be connected in this way with n leads, i.e., in the example shown in FIG. 1, $5 \times 4 \times 3 = 60$ phototransistors with 5 leads. In order to provide a clearer overall picture, the 60 phototransistors $T_1 \ldots T_{60}$ in FIG. 1 are combined to form five groups $G_1 \ldots G_5$ with 12 phototransistors each, with the base connections of the 12 phototransistors of one group all connected to each other and to one lead. Within each group, the collector connections of every 3 phototransistors are connected to a second lead, while the emitter connections of these 3 phototransistors are connected to the 3 remaining leads.

In order to operate the arrangement shown in FIG. 1, the 5 leads $Z_1 \ldots Z_5$ are connected to a trigger circuit which can allocate 3 states to each lead.

Figure 2:
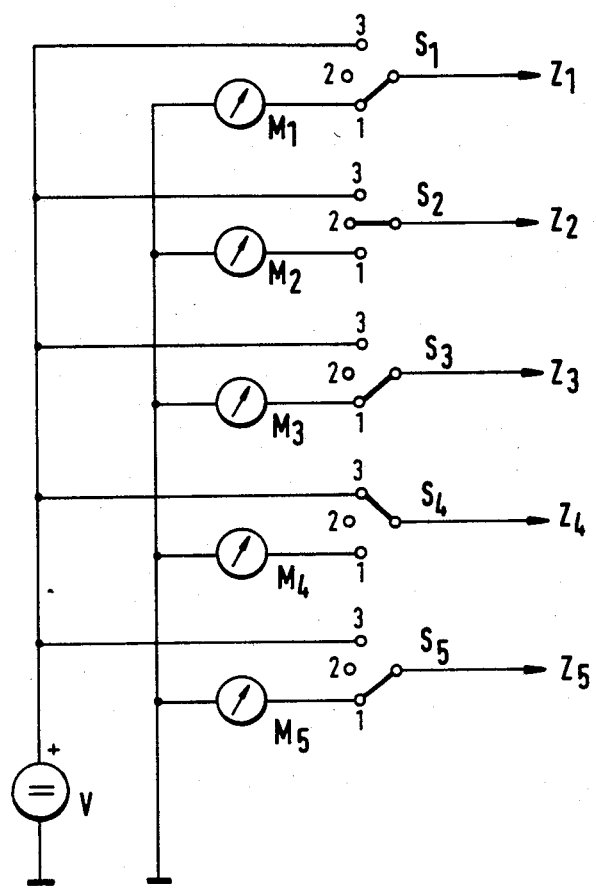
FIG. 2 shows a trigger circuit consisting of five selector switches, one voltage source and five current meters.

FIG. 2 shows a simple example of such a trigger circuit consisting of 5 selector switches $S_1 \ldots S_5$ with three switch positions 1, 2 and 3 each, a voltage source V and 5 current meters $M_1 \ldots M_5$. The value of the voltage source F is so selected that, on the one hand, the voltage cannot drive a noticeable current over the base-emitter path of each phototransistor, but, on the other hand, is strong enough to be able to drive a noticeable current over the collector-emitter path of each phototransistor when the phototransistor is illuminated. In the case of silicon phototransistors, this voltage typically lies within the range of from 0.2 to 0.5 volts.

Of the 5 selector switches $S_1 \ldots S_5$, one each is put into switch positions 2 and 3, while the others are placed in switch position 1. In the example in FIG. 2, $S_2$ is in position 2, $S_4$ is in position 3, while $S_1$, $S_3$ and $S_5$ are in position 1. Accordingly, lead $Z_2$ is open, lead $Z_4$ is connected to the positive terminal of the voltage source V, and leads $Z_1$, $Z_3$ and $Z_5$ are grounded via the current meters $M_1$, $M_3$ and $M_5$. In this switch state, the illumination of the three phototransistors $T_{28}$, $T_{29}$ and $T_{30}$ can be determined at the current meters $M_1$, $M_3$ and $M_5$. All other 57 phototransistors are ineffective, as is apparent from the following compilation:

There are precisely 13 different states which the phototransistors can take on:

| State No. | Emitter | Base | Collector | Description |
|---|---|---|---|---|
| 1 | grounded | grounded | grounded | no current flow |
| 2 | grounded | grounded | open | " |
| 3 | grounded | grounded | positive | " |
| 4 | grounded | open | grounded | " |
| 5 | positive | grounded | grounded | " |
| 6 | open | grounded | grounded | " |
| 7 | positive | grounded | grounded | " |
| 8 | grounded | open | positive | normal operation |
| 9 | grounded | positive | open | no current flow |
| 10 | open | grounded | positive | " |
| 11 | positive | grounded | open | " |
| 12 | open | positive | grounded | " |
| 13 | positive | open | grounded | inverse operation |

Only the phototransistors $T_{28}$, $T_{29}$ and $T_{30}$ are in state No. 8 "normal operation". The phototransistors $T_{25}$, $T_{32}$ and $T_{35}$ are in state No. 13 "inverse operation". During inverse operation, however, the light-sensitivity is substantially reduced compared to normal operation, so that the current flowing through these phototransistors can be neglected. Similarly, only negligibly small currents flow in states No. 1 to No. 7 and No. 9 to No. 12.

What is claimed is:

1. A circuit arrangement comprising: a plurality of phototransistors each having a base electrode, a collector electrode and an emitter electrode, the number of said transistors being equal to $n(n-1)(n-2)$, where n is an integer having a value of at least 3; a plurality of leads equal in number to n, with each said electrode of each of said phototransistors being connected to a respective one of said leads in a manner such that said base electrode, said collector electrode and said emitter electrode of each of said phototransistors are connected to a selected group of three of said leads in a pattern such that said selected group of three leads is connected in a unique sequence to said base, collector and emitter electrodes of only one said phototransistor, a plurality of current detecting devices each having a first terminal connected to ground and a second terminal, each detecting device being responsive to a current flowing between its first and second terminals such that Current exceeds a selected minimum value; a voltage source providing a voltage having a selected value such that application of a voltage having the selected value between said base electrode and emitter electrode of any one of said phototransistors produces a current at said emitter electrode which does not exceed the selected minimum value and application of a voltage having the selected value between said collector electrode and emitter electrode of any one of said phototransistors when that said phototransistor is illuminated produces a current at said emitter electrode which exceeds the selected minimum value; and a plurality of switching members each connected to a respective one of said leads, to said voltage source and to said second terminal of a respective one of said current detecting devices, each of said switching members being switchable to a selected one of: a first switching state for conductively connecting said respective one of said leads to said second terminal of said respective one of said current detecting devices; a second switching state in which said respective one of said leads is open-circuited; and a third switching state in which said respective one of said leads is conductively connected to said voltage source, said switching members being operative such that, at any moment, only one of said switching members is in said second switching state and only one of said switching members is in said third switching state.

2. An arrangement according to claim 1, wherein the phototransistors consist of silicon.

3. An arrangement according to claim 1, wherein the voltage provided by said voltage source has a value of between 0.2 and 0.5 volts.

4. An arrangement according to claim 1 comprising a single crystal of semiconductor material containing all of said phototransistors.

* * * * *